MOSFET DIGITAL GATE

Filed Sept. 13, 1967

WALTER C. SEELBACH
PHILIP B. FOSTER
INVENTORS

BY [signature]

ATTY'S

United States Patent Office 3,541,353
Patented Nov. 17, 1970

3,541,353

MOSFET DIGITAL GATE

Walter C. Seelbach and Philip B. Foster, Scottsdale, Ariz., assignors to Motorola, Inc., Franklin Park, Ill., a corporation of Illinois Filed Sept. 13, 1967, Ser. No. 667,575
Int. Cl. H03k *17/00, 19/08*
U.S. Cl. 307—246 11 Claims

ABSTRACT OF THE DISCLOSURE

A metal-oxide-semiconductor digital logic gate in which complementary insulated gate field effect transistors are cascaded to complementary bipolar transistors to enhance the capacitive load driving capability of the gate. A single common input simultaneously couples an input signal to the insulated gate field effect transistors which are connected at a common output junction to the bipolar transistors.

BACKGROUND OF THE INVENTION

This invention relates generally to digital logic circuitry and more particularly to a combination of unipolar and bipolar devices in high speed digital logic circuits having an improved capacitive load driving capability.

Previously, complementary insulated gate field-effect transistors (also referred to as metal-oxide-semiconductor field effect transistors and abbreviated herein at IGFETS) have been used as drivers and in other digital logic applications to perform switching functions in response to binary input signals. However, these circuits are relatively slow in operation as a result of the inability of the IGFETS to drive capacitive loads at high speeds.

SUMMARY OF THE INVENTION

An object of this invention is to provide new and improved high speed logic circuitry.

Another object of this invention is to provide improved digital logic circuitry utilizing insulated-gate field-effect transistors which require substantially zero power under steady state conditions and consume very low internal transient power.

Another object of this invention is to provide logic circuitry of the type described which is capable of driving capacitive loads at very high speeds.

A further object of this invention is to provide logic circuitry of the type described which responds to large input logic swings and has a high degree of noise immunity.

The present invention features a pair of complementary N channel and P channel insulated-gate field-effect transistors serially connectable to a voltage supply terminal so that one of the field effect transistors functions as a load on the other. Complementary bipolar transistors are connected to the insulated-gate field-effect transistors and provide an improved current drive characteristic and serve to rapidly discharge the capacitive loads driven thereby.

Another feature of this invention is the provision of NOR and NAND logic gates in which complementary insulated-gate field-effect transistors are cascaded to one or more pairs of complementary bipolar transistors to provide excellent output current drive at high switching speeds.

IN THE DRAWINGS

BRIEF DESCRIPTION OF THE INVENTION

Briefly described, the invention is embodied in digital logic circuitry which may be constructed in monolithic integrated form and includes a complementary pair of insulated-gate field-effect transistors serially connected at a common junction so that one field-effect transistor functions as a load on the other. The gate electrodes of the field-effect transistors are connected to a single input terminal to which binary input signals are applied, and at least one pair of complementary bipolar transistors are cascaded to the common junction of the field effect transistors. The bipolar transistors impart to the circuitry an excellent output current drive capability and provide a rapid discharge of capacitive loads which are coupled thereto.

DETAILED DESCRIPTION OF THE INVENTION

Figure 1:
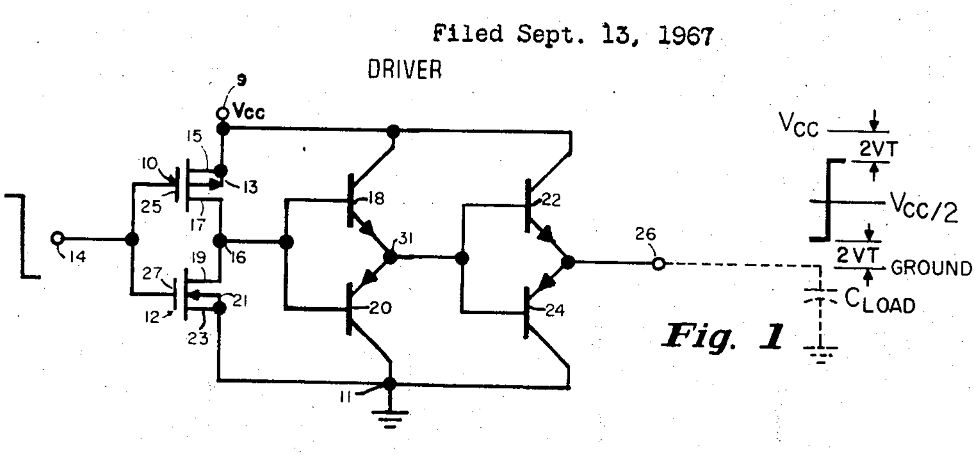
FIG. 1 illustrates in schematic diagram a driver circuit according to this invention.

Referring in detail to the accompanying drawing, there is shown in FIG. 1 a transistor driver circuit embodiment of this invention including first and second complementary insulated gate field-effect transistors 10 and 12 serially connected between a supply voltage $V_{CC}$ at terminal 9 and a reference potential at terminal 11. The IGFET 10 has its substrate gate electrode 13 tied to the source electrode 15 at terminal 9, and the drain electrodes 17 and 19 of the IGFETS 10 and 12, respectively, are connected to a common junction 16. The IGFET 12 has its substrate gate electrode 21 connected to the source electrode 23 at ground (or reference) terminal 11, and the gate electrodes 25 and 27 of the IGFETS 10 and 12, respectively, are connected to a single input terminal 14 to which binary input signals are applied.

A first complementary pair of bipolar transistors 18 and 20 is connected between the common junction 16 and an intermediate point 31 in the circuit, and a second complementary pair of bipolar transistors 22 and 24 is cascaded to the first pair of complementary bipolar transistors 18 and 20 as shown. In some applications it may be desired to use a single complementary pair of bipolar transistors 18 and 20, and in other applications it may be desired to cascade additional pairs of bipolar transistors to the circuit output terminal 26 in order to increase the current gain of the circuit.

The circuit in FIG. 1, as well as the circuits in FIGS. 2 and 3 to be described below, are capable of driving capacitive loads at high speeds, and these loads are designated by the capacitor and $C_{LOAD}$ notation at the output terminal 26.

The novelty of the combination of complementary bipolar transistors and complementary IGFETS 10 and 12 will be more fully appreciated by first considering the operation of a single complementary pair of IGFETS (such as transistors 10 and 12 in FIG. 1) which are connected directly to a capacitive load. The discharge current $i$ conducted by an IGFET, e.g., IGFET 12 in FIG. 1 from a capacitive load may be written as:

$$i=g_m(e_{in}-e_g) \quad \text{(Eq. 1)}$$

where $g_m$ is the transconductance of the IGFET in the discharge path of the capacitive load, $e_{in}$ is the most positive input voltage level and $e_g$ is the threshold voltage required to turn on the IGFET.

The discharge current $i$ may also be expressed as:

$$i=C\frac{\Delta e}{\Delta t_f} \quad \text{(Eq. 2)}$$

where the $\Delta e$ is equal to the change in output voltage, i.e., logic swing, $\Delta t_f$ is the fall time of the output pulse across a capacitive load and C is the capacitance of the load. Therefore, $\Delta t_f$ can be written as:

$$\Delta t_f = \frac{C\Delta e}{g_m(e_{in} - e_g)} \quad \text{(Eq. 3)}$$

The input logic swing will also be equal to $\Delta e$. If $e_g$ is equal to $\Delta e/2$, then $\Delta t_f$ can be written as:

$$\Delta t_f = \frac{2C\Delta e}{g_m \Delta e} = \frac{2C}{g_m} \quad \text{(Eq. 4)}$$

Therefore, it is seen that the fall time of the output pulse is inversely proportional to the $g_m$ of the insulated-gate field-effect transistor which discharges the capacitive load. Since this $g_m$ is relatively low for an insulated-gate field-effect transistor, e.g., $g_m$ is typically between 100 and 1000 micromhos, then the fall time $\Delta t_f$ of the output pulse is relatively long. For example, if the output capacitance C is 10 picofarads and the transconductance $g_m$ is 100 micromhos, then $\Delta t_f$ will be $2 \times 10^{-6}$ or 200 nanoseconds—a relatively long fall time.

In accordance with the present invention, the pairs of cascaded complementary bipolar transistors 18, 20, and 22, 24 in FIG. 1 provide the beta action necessary to multiply the current $i$ (which is to multiply the term $g_m$ in Eq. 4) and substantially decrease the fall time $\Delta t_f$. Consider the operation of the circuit in FIG. 2 when binary logic signals are applied to the input terminal 14. A negative going binary signal applied to terminal 14 will turn on the P channel IGFET 10 upon reaching the threshold level $e_g$ and the same signal will simultaneously turn off the N channel IGFET 12. When the P channel IGFET 10 conducts, current will flow through the channel region thereof, into the base of bipolar transistor 18 and from the emitter of transistor 18 into the base of transistor 22. When bipolar transistor 22 conducts, the capacitive load $C_{LOAD}$ will be charged. On the trailing, positive going edge of the logic signal which is applied to input terminal 14, the N channel IGFET 12 will be turned on when its threshold voltage $e_g$ is reached, and capacitive load will now be discharged through the emitter-base paths of transistors 24 and 22 and through the IGFET 12 to ground. The NPN bipolar transistors 18 and 22 and the P channel IGFET 10 charge the capacitive load C, whereas the PNP bipolar transistors 24 and 20 and the N channel IGFET 12 discharge the capacitive load C. The discharge current flowing from $C_{LOAD}$ will be $(\beta+1)^2 i$ where $\beta$ is the current gain of each of the two bipolar transistors 24 and 20, and the equation for the fall time, $\Delta t_f$ can now be written as $$\Delta t_f = \frac{2C}{(\beta+1)^2 g_m} \approx \frac{2C}{\beta^2 g_m} \quad \text{(Eq. 5)}$$

since $\beta+1$ is approximately equal to $\beta$.

For example, if $\beta$ is 100 (a typical value of transistor current gain), then the $\Delta t_f$ of 200 nanoseconds calculated above will be reduced to 20 picoseconds, or by a factor of 10,000. Thus, by combining the cascaded complementary bipolar transistors with complementary unipolar insulated-gate field-effect transistors in the above-described combination illustrated in FIG. 1, the switching time of the circuit is greatly reduced.

Figure 2:
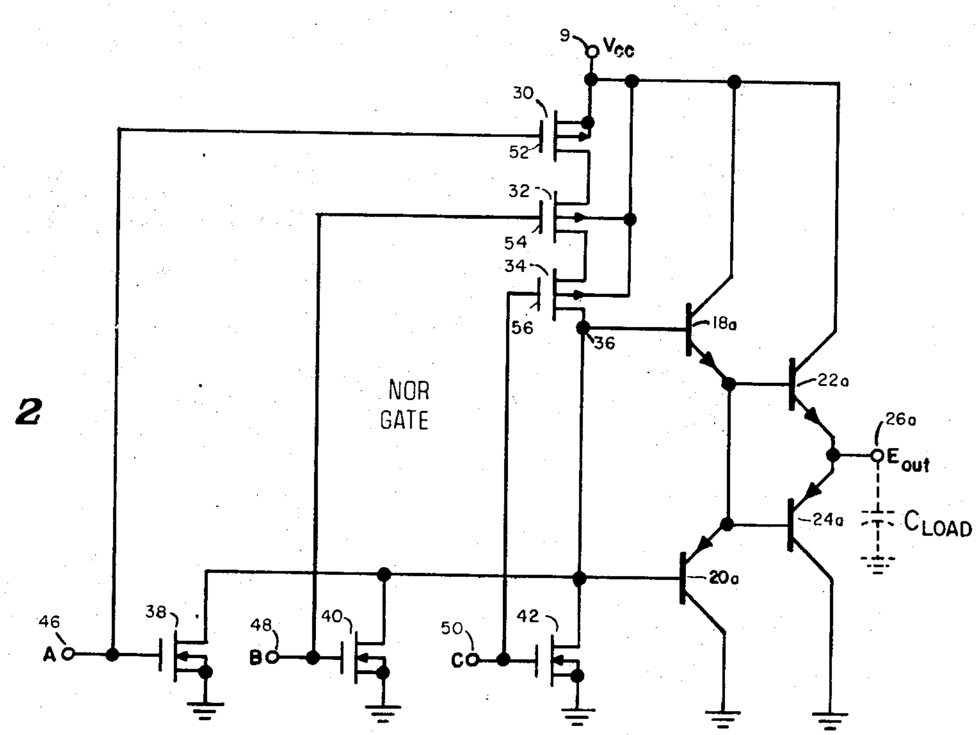
FIG. 2 illustrates in schematic diagram a NOR gate according to this invention.
Figure 3:
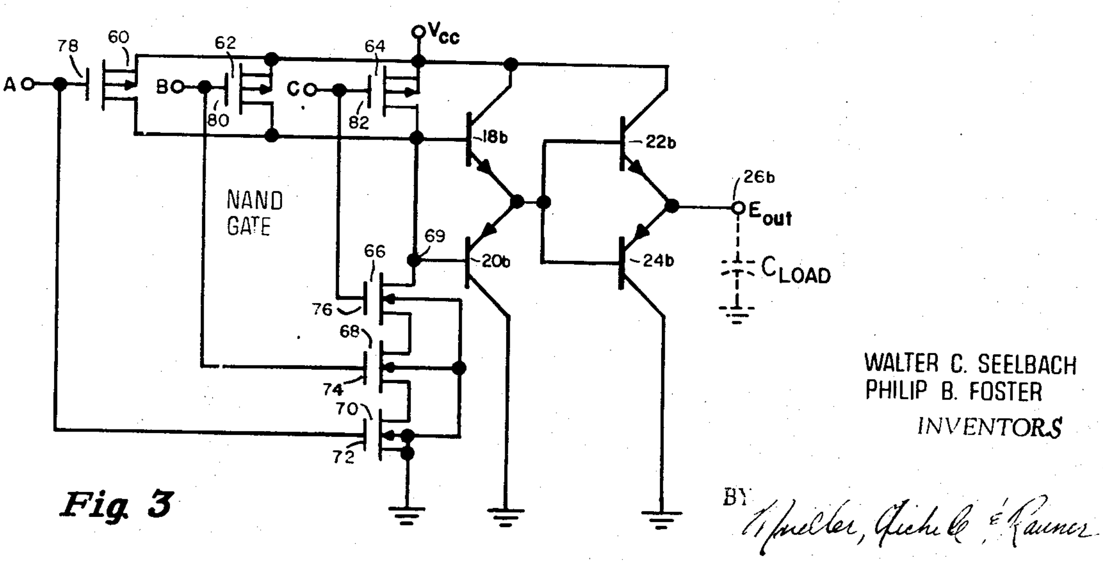
FIG. 3 illustrates in schematic diagram a NAND gate according to this invention.

The logic circuits in FIGS. 2 and 3 illustrate novel applications of the combination IGFET and bipolar transistor circuitry described above with reference to FIG. 1. In FIGS. 2 and 3 the reference numerals which identify the bipolar transistor circuitry correspond to the reference numerals in FIG. 1, differing only in the $a$ and $b$ subscripts for the circuits in FIGS. 2 and 3, respectively. Accordingly, the description of operation of the bipolar complementary transistor circuitry in FIG. 1 also applies to FIGS. 2 and 3.

In the NOR circuit of FIG. 2, three IGFETS 30, 32 and 34 are connected in series between the $V_{CC}$ supply terminal 9 and a junction 36 which is common to the bases of complementary transistors **18*a* and 20*a*. Parallel connected IGFETS 38, 40, and 42 are connected as shown between the base of transistor 20*a* and ground, and input logic terminals 46, 48, 50 are connected to sources of input logic signals A, B, and C, respectively. The latter logic signals are simultaneously applied to the gate electrodes 52, 54, and 56 of the serially connected IGFETS 30, 32 and 34. If any one input A, B, or C swings high, the capacitive load $C_{LOAD}$ connected to the output terminal 26*a* will be discharged through bipolar transistors 24*a* and 20*a* and through the particular N channel IGFET 38, 40, 42 to which the A, B, or C logic signals are applied. The positive going logic signal A, B, or C is simultaneously applied to one of the series connected IGFETS 20, 32 and 34, and insures that one of these IGFETS is cut off during the time that the capacitive load $C_{LOAD}$ is being discharged. When one of the IGFETS 38, 40, or 42 is conducting, junction 36 is approximately at ground potential and the output terminal 26*a* will be approximately two diode drops above ground or $2_{VT}$ (the $2V_{BE}$ of transistors 24*a* and 20*a***).

When the logic signals A, B, and C all swing negative concurrently, IGFETS 30, 32, and 34 will be biased into conduction and provide a drive current from $V_{CC}$ and through the bipolar transistors **18*a* and 22*a* to charge up the capacitive load $C_{LOAD}$. The voltage drop across the serially connected IGFETS 30, 32 and 34 is negligible and the output logic signal at terminal 26*a* will swing from $2_{VT}$ to $V_{CC}-2_{VT}$, the latter $2_{VT}$ accounted for by the $2V_{BE}$ of bipolar transistors 18*a* and 22*a***.

Referring now to the NAND logic circuit in FIG. 3, the series and parallel connected IGFETS have been alternated in their respective positions as shown in FIG. 2, and IGFETS 60, 62, and 64 are connected in parallel between the $V_{CC}$ supply and the bipolar transistor **18*b*. Serially connected IGFET's 66, 68, and 70 are connected between a common junction 69 at the bases of transistors 18*b* and 20*b* and ground potential and the gate electrodes 72, 74, and 76 of the serially connected IGFETS 70, 68, and 66 are connected to the gate electrodes 78, 80, and 82 of the parallel connected IGFETS 60, 62, and 64 respectively. For the NAND logic operation in FIG. 3, a signal inversion will occur if signals A and B and C applied to the serially connected IGFETS 66, 68, and 70 are all high at a logic ONE level (using positive logic). When this condition obtains, the capacitive load $C_{LOAD}$ will discharge through bipolar transistors 24*b* and 20*b* and through the IGFETS 66, 68, and 70 to ground. Output terminal 26*b*** is now at $2_{VT}$ above ground.

If any one of the input signals A or B or C is not high, then the path from the output terminal **26*b* to ground is blocked and the capacitive load $C_{LOAD}$ will charge through bipolar transistors 18*b* and 22*b* and through the conducting IGFET 60, 62, or 64** to $V_{CC}-2_{VT}$ in the manner described previously.

The circuits described above have a high degree of noise immunity since the switching threshold is $V_{CC}/2$ or half way in the input logic swing. If the P-channel and N-channel IGFETS are reasonably well matched in $e_g$ and $g_m$, the switching threshold will automatically track $V_{CC}$, and remain at $V_{CC}/2$, as long as $e_g$ is less than $V_{CC}/2$. This is due to equal conduction of the complementary IGFETS at $e_{in}=V_{CC}/2$, resulting in $V_{CC}/2$ out. Such noise immunity is desirable in many computer applications in which the above described circuits will be used.

The first and second IGFETS 10 and 12 in FIG. 1 correspond respectively to IGFETS 34 and 42 in FIG. 2 and IGFETS 64 and 66 in FIG. 3. However, to perform the NOR and NAND logic functions described above, third through sixth IGFETS 32, 40, 30 and 38 have been included in FIG. 2 and third through sixth IGFETS 68, 62, 70 and 60 have been included in FIG. 3.

The circuit embodiments described above may be modified by one skilled in the art without departing from the scope of this invention. For example, many other input gate configurations can be added to those shown in FIGS.

1–3 to increase the logic capability of the circuits. Accordingly, the invention is limited only by the following claims.

We claim:

1. Logic circuitry adapted for driving high capacitive loads including, in combination:

(a) first and second complementary field-effect transistors serially connected at a common junction and adapted to be connected between potential supply means and a reference potential so that the first and second field-effect transistors alternately conduct, and that one of the field-effect transistors functions as a load on the other, said first and second field-effect transistors connectable to a common source of binary input logic signals which alternately drive the first and second field-effect transistors into conduction, (b) a first bipolar transistor connected between said common junction and a circuit output terminal for enhancing the current gain of the circuit and driving output loads which are connectable to said output terminal, and (c) a second bipolar transistor coupled between said circuit output terminal and said common junction for providing a rapid discharge of capacitive loads connected to said output terminal.

2. Logic circuitry as defined in claim 1 which further includes:

(a) a third bipolar transistor connected between a common output point of said first and second bipolar transistors and said circuit output terminal for further enhancing the current gain of said logic circuitry, and (b) a fourth bipolar transistor connected between said circuit output terminal and said common junction of said first and second bipolar transistors for reducing the time required to discharge capacitive loads connected to said circuit output terminal.

3. Logic circuitry as defined in claim 1, connected to a logic gate and further including:

(a) a plurality of serially connected field effect transistors connected between said first field effect transistors and said voltage supply terminal, each of said plurality of series connected field effect transistors having separate inputs connectable to binary logic signal so that when all of said inputs receive binary logic signals at a predetermined logical level, a conductive path is completed between said voltage supply terminal and said first bipolar transistor for providing a current drive at said circuit output terminal and driving capacitive loads connected thereto, and (b) a plurality of parallel connected field effect transistors connected between said common junction and said reference potential, said plurality of parallel connected field effect transistors connected to said binary logic signals so that when any one of said plurailty of parallel connected field effect transistors receives a binary logic signal at a predetermined logical level it conducts and clamps said common junction at substantially ground potential and provides a discharge path for capacitive loads connected to said circuit output terminal.

4. Logic circuitry as defined in claim 1, connected as a logic gate which includes:

(a) plurality of parallel connected field effect transistors including said first field effect transistor connected between said voltage supply terminal and said first bipolar transistor, said plurality of parallel connected field effect transistors having separate inputs connected to sources of binary logic signals respectively, so that if any one of said plurality of parallel connected field effect transistors receives a binary logic signal at a predetermined logic level, that one field effect transistor is biased into conduction to provide current drive at said circuit output terminal and drive capacitive loads connected thereto, and (b) a plurality of series connected field effect transistors including said second field effect transistor serially connected between said common junction and a point of reference potential, so that said plurality of series connected transistors provided a conductive path from said second bipolar transistor to discharge capacitive loads connected to said circuit output only when binary logic signals applied to the inputs of said serially connected field effect transistors are all at a predetermined logical level.

5. Logic circuitry including, in combination:

(a) first and second complementary insulated gate field-effect transistors serially connected to a common junction and connectable between a voltage supply terminal and a reference potential so that when the binary logic signals are applied to said field-effect transistors, one of the field-effect transistors functions as a load on the other, (b) a first bipolar transistor coupled between said common junction, a circuit output terminal and enhancing current drive to loads connected to said circuit output terminal when binary logic signals applied to said first and second insulated gate field effect transistors are at a first logical level, and (c) a second bipolar transistor coupled between said circuit output terminal and said common output for providing a discharge path for said capacitive loads when binary logic signals applied to said first and second insulated gate field effect transistors are at a second logical level.

6. Logic circuitry as defined in claim 5, which further includes:

(a) a third bipolar transistor connected between a common output point of said first and second bipolar transistors and said circuit output terminal for enhancing the current gain of said logic circuitry, and (b) a fourth bipolar transistor coupled between said circuit output terminal and said common output point of said first and second bipolar transistors for improving the capacitive load discharging capability of said logic circuitry.

7. Logic circuitry as defined in claim 5 which further includes:

(a) a third insulated gate field effect transistor serially connected to said first insulated gate field effect transistor and between said voltage supply terminal and said first bipolar transistor so that when logic signals applied to said first and third insulated gate field effect transistors reach a predetermined logical level, a current path is completed through said first and third insulated gate field effect transistors to provide current drive to said circuit output terminal, and (b) a fourth insulated gate field effect transistor connected in parallel with said second insulated gate field-effect transistor so that when binary logic signals applied to either said second or said fourth insulated gate field effect transistor reach a predetermined logical level, said second or fourth insulated gate field effect transistor is biased into conduction to complete a discharge path from said circuit output terminal to a point of reference potential to thereby rapidly discharge capacitive loads connected to said output terminal.

8. Logic circuitry as defined in claim 7 which further includes:

(a) a fifth insulated-gate field-effect transistor serially connected to said first and second insulated-gate field-effect transistors between said voltage supply terminal and said first bipolar transistor, said first, third, and fifth insulated gate field effect transistors biased into conduction when binary logic signals applied to the last named transistors all reach a predetermined logic level to complete a conductive path between said voltage supply terminal and said first bipolar transistor and provide a current drive to said circuit output terminal, and (b) a sixth insulated gate field effect transistor connected in parallel with said second and fourth insulated gate field effect transistors and further connected to a source of binary logic signals so that when any one of said second, fourth, or sixth insulated-gate field-effect transistors receives a binary logic signal at a predetermined logic level, a current path between said common junction and said point of reference potential is completed to thereby discharge capacitive loads connected to said circuit output terminal.

9. Logic circuitry as defined in claim 5, which further includes:

(a) a third insulated gate field effect transistor connected in parallel with said first insulated gate field effect transistor and connected between said voltage supply terminal and said first bipolar transistor so that when binary logic signals at a predetermined logical level are applied to either said first or third insulated gate field effect transistors, a current path is completed from said voltage supply terminal to said first bipolar transistor to provide drive current to loads connected to said circuit output terminals, and (b) a fourth insulated gate field effect transistor serially connected to said second insulated gate field effect transistor between said common junction and said point of reference potential so that when logic signals at a predetermined logical level are applied to both said second and said fourth insulated gate field effect transistors, a conductive path from said circuit output terminal and to said point of reference potential is completed to rapidly discharge capacitive loads connected to said circuit output terminal.

10. Logic circuitry as defined in claim 9 which further includes:

(a) a fifth insulated gate field effect transistor connected in parallel with said first and third insulated gate field-effect transistors and further connectable to binary logic signals so that when any one of said first, third or fifth insulated-gate field-effect transistors receives binary logic signals at a predetermined logical level, said one transistor is biased into conduction to provide current drive to loads connected to said circuit output terminal, and (b) a sixth insulated-gate field-effect transistor serially connected to said second and fourth insulated gate field effect transistors so that in order to complete a conductive path from said common junction to said point of reference potential, binary logic signals at a predetermined logical level must be applied to all of said second, fourth, and sixth insulated gate field effect transistors to thereby provide a discharge path from said circuit output terminal to rapidly discharge capacitive loads connected thereto.

11. Logic circuitry including, in combination:

(a) a pair of field effect transistors of opposite conductivity types, each having first and second electrodes separated by a channel defining a conductive path for charge carriers, and a control electrode for controlling the conductance of said channel, (b) means for directly connecting the control electrodes of said transistors, (c) means for serially connecting together the first-to-second electrode conductive paths of said transistors so that one transistor functions as a load on the other, and (d) a pair of complementary bipolar transistors connected in parallel and between a common junction of said first and second field effect transistors and a circuit output terminal for alternately conducting and enhancing respectively a drive current to loads connected to said circuit output terminal and a discharge path for rapidly discharging capacitive loads connected to said circuit output terminal.

References Cited

UNITED STATES PATENTS

| | | | |
|---|---|---|---|
| 3,157,797 | 11/1964 | Eshelman | 307—246 |
| 3,299,291 | 1/1967 | Warner | 307—215 |
| 3,348,064 | 10/1967 | Powlys | 307—215 |
| 3,378,783 | 4/1968 | Gibson | 330—38 |
| 3,395,291 | 7/1968 | Bogert | 307—246 |
| 3,401,359 | 9/1968 | Becker | 307—251 |

JOHN S. HEYMAN, Primary Examiner

D. M. CARTER, Assistant Examiner

U.S. Cl. X.R.

307—205, 215, 251